United States Patent [19]
Millar

[11] Patent Number: 5,633,607
[45] Date of Patent: May 27, 1997

[54] EDGE TRIGGERED SET-RESET FLIP-FLOP (SRFF)

[75] Inventor: Bruce Millar, Stittsville, Canada

[73] Assignee: Mosaid Technologies Incorporated, Kanata, Canada

[21] Appl. No.: 430,228

[22] Filed: Apr. 28, 1995

[51] Int. Cl.$^6$ .................. H03K 3/355; H03K 3/356
[52] U.S. Cl. .............. 327/217; 327/18; 327/227; 327/294; 327/33
[58] Field of Search ................... 327/199–203, 327/215, 217, 218, 219, 225, 18, 20, 227, 291, 294, 299, 244, 28–30; 377/33–36, 45–46

[56] References Cited

U.S. PATENT DOCUMENTS

| | | | |
|---|---|---|---|
| 3,509,381 | 4/1970 | Marshall, Jr. | 327/219 |
| 3,882,325 | 5/1975 | Sakalay | 327/225 |
| 4,300,060 | 11/1981 | Yu | 307/272 |
| 4,394,769 | 7/1983 | Lull | 327/208 |
| 4,568,843 | 2/1986 | Gloanec et al. | 327/217 |
| 5,059,818 | 10/1991 | Witt et al. | 327/217 |
| 5,065,052 | 11/1991 | Sakagari et al. | 327/217 |

FOREIGN PATENT DOCUMENTS

| | | | |
|---|---|---|---|
| 000098203 | 1/1984 | European Pat. Off. | 327/225 |
| 355109028 | 8/1980 | Japan | 327/225 |
| 356138325 | 10/1981 | Japan | 327/215 |
| 362029215 | 2/1987 | Japan | 327/225 |
| 403091314 | 4/1991 | Japan | 327/217 |

*Primary Examiner*—Timothy P. Callahan
*Assistant Examiner*—T. Lam
*Attorney, Agent, or Firm*—Pascal & Associates

[57] ABSTRACT

A timer comprised of first and second gated SR (set-reset) latches each including two pair (S1, S2 and R1, R2) of inputs and a pair of outputs (Q, QN), the Q output of the first latch being connected to the R2 input of the second latch, and the QN output of the first latch being connected to the S2 input of the second latch, the Q output of the second latch being connected to the S2 input of the first latch, and the QN output of the second latch being connected to the R2 input of the first latch, apparatus for applying a delayed representation of a first pulse signal to the S1 input of the first latch and apparatus for applying a delayed representation of a second pulse signal to the R1 input of the first latch, apparatus for applying an inverted representation of the pulse signal to the S1 input of the second latch and apparatus for applying an inverted representation of the second pulse signal to the R1 input of the second latch, whereby timed output signals representing a differential between leading edges of the first and second pulse signals are provided at the outputs Q, QN of the second latch.

6 Claims, 4 Drawing Sheets

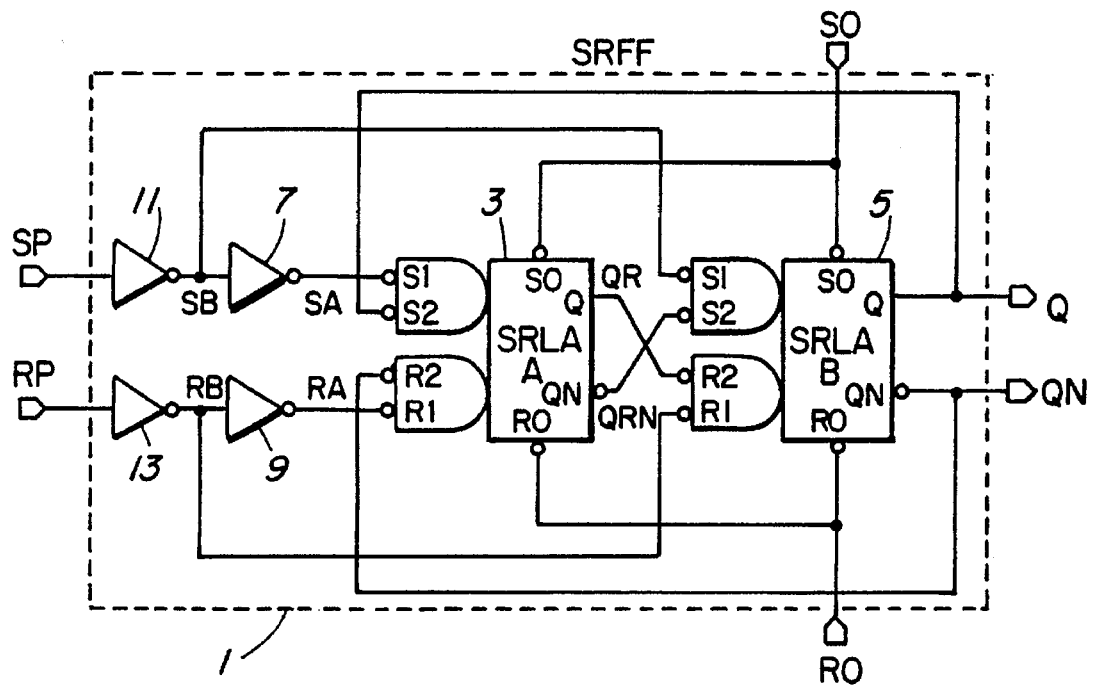
FIG. 1
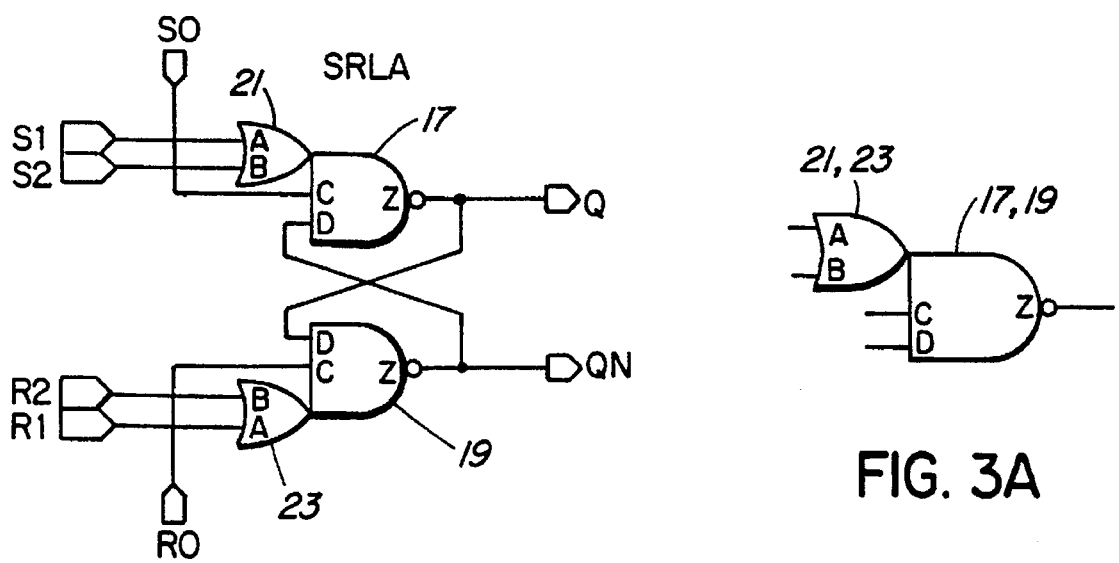
FIG. 2
FIG. 3A

EDGE TRIGGERED SET-RESET FLIP-FLOP (SRFF)

FIELD OF THE INVENTION

This invention relates to improvements in a timing pulse generator.

BACKGROUND TO THE INVENTION

The timing between the rising edges of two pulse signals can be determined by an edge triggered D-type flip flop, with its D input connected to a high logic level. The rising edge of a pulse applied to the clock input of the flip flop sets the flip flop, causing the rising edge of an output signal pulse to be generated, and a pulse applied to the reset input of the flip flop clears the flip flop, causing the falling edge of the output signal pulse to be generated.

However, the shortest time interval of the output pulse using this technique is limited by the reset recovery time of the flip flop, and how narrow the reset pulse can be made. This technique is thus not suitable for high frequency pulse signals, signals having very short differentials in timing between input (set and reset) signals, and input signals having very short pulse widths.

SUMMARY OF THE INVENTION

The present invention overcomes the aforenoted problems by generating an output pulse in which its rising and falling edges are uniquely defined by the rising edges of two separate and independent input pulse waveforms of arbitrary width. The output pulse frequency, timing and width is not limited by flip flop recovery times associated with direct sets and resets of a flip flop, as in the aforenoted prior art technique. As a result, very narrow output pulse signals resulting from a short timing differential between the rising edges of the two input signals, and very high frequency output pulse signals can be provided.

As a result, significantly improved ripple counters, pulse generators and rising edge detectors can be produced.

In accordance with an embodiment of the invention, a timer is comprised of first and second gated SR (set-reset) latches each including two pair (S1, S2 and R1, R2) of inputs and a pair of outputs (Q, QN), the Q output of the first latch being connected to the R2 input of the second latch, and the QN output of the first latch being connected to the S2 input of the second latch, the Q output of the second latch being connected to the S2 input of the first latch, and the QN output of the second latch being connected to the R2 input of the first latch, apparatus for applying a delayed representation of a first pulse signal to the S1 input of the first latch and apparatus for applying a delayed representation of a second pulse signal to the R1 input of the first latch, and apparatus for applying an inverted representation of the pulse signal to the S1 input of the second latch and apparatus for applying an inverted representation of the second pulse signal to the R1 input of the second latch, whereby timed output signals representing a differential between leading edges of the first and second pulse signals are provided at the outputs Q, QN of the second latch.

BRIEF INTRODUCTION TO THE DRAWINGS

A better understanding of the invention will be obtained by reading the description of the invention below, with reference to the following drawings, in which:

FIG. 1 is a logic circuit of an embodiment of the present invention,

FIG. 2 is a logic circuit of one of the components of the embodiment of FIG. 1,

FIGS. 3 and 3A are schematic diagrams of components of FIG. 2,

DETAILED DESCRIPTION OF THE INVENTION

Figure 3:
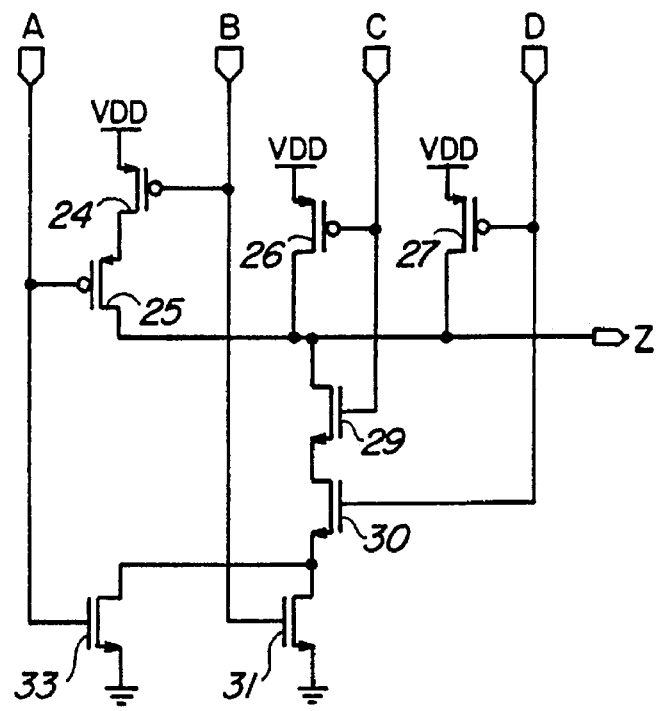

FIG. 1 illustrates a first embodiment of the invention, which is an edge triggered set-reset flip flop circuit 1 (SRFF). The SRFF is comprised of a first set-reset latch 3 having separate gated inputs S1, S2 and R1, R2, and a second set-reset latch 5 having separate gated inputs S1, S2 and R1, R2. The latches will be described in more detail below. Each of the latches has a pair of outputs Q and QN, and direct set and reset inputs SD and RD.

The Q output of latch 5 is connected to the S2 input of latch 3 and the QN output of latch 5 is connected to the R2 input of latch 3. The Q output of latch 3 is connected to the R2 input of latch 5 and the QN output of latch 3 is connected to the S2 input of latch 5.

An independent pulse input signal is applied from an SB node to the S1 input of latch 5, and another independent pulse input signal is applied from an RB node to the R1 input of latch 5. The pulse signal from the SB node is delayed in an inverter 7 and the resulting delayed signal is applied as the SA signal to the S1 input of latch 3. The pulse signal from the RB node is delayed in an inverter 9 and the resulting delayed signal is applied as the RA signal to the R1 input of latch 3.

The input signals can be applied via SP and RP terminals respectively, and buffered by inverters 11 and 13 before being applied to the SB and RB nodes. Output signals are obtained at the Q and QN outputs of latch 5, on the Q and QN terminals, in accordance with the following truth table, wherein (r) designates a rising edge of a signal:

| SP  | RP  | SD | RD | Q  | QN |
|-----|-----|----|----|----|----|
| (r) | (r) | 1  | 1  | QN | Q  |
| X   | (r) | 1  | 1  | 0  | 1  |
| (r) | X   | 1  | 1  | 1  | 0  |
| X   | X   | 1  | 0  | 0  | 1  |
| X   | X   | 0  | 1  | 1  | 0  |
| X   | X   | 0  | 0  | 1  | 1  |

The preferred structure of each latch is shown in FIG. 2. Each of a pair of 3 input NAND gates 17 and 19 has a 2 input OR gate 21 and 23 connected with its output to one of the inputs of a corresponding NAND gate. The inputs of the respective OR gates are the aforenoted S1, S2 inputs, to OR gate 21, and R1, R2 inputs, to OR gate 23. The output of NAND gate 17, connected to the Q output terminal, is connected to one input of NAND gate 19 and the output of NAND gate 19, connected to the QN terminal, is connected to one input of NAND gate 17. The remaining input of NAND gate 17 is connected to a source of active low logic level set signals SD, and the remaining input of NAND gate 19 is connected to a source of active low logic level reset signals RD.

The operation truth table for the latch of FIG. 2 is as follows:

| S1 or S2 | R1 or R2 | SD | RD | Q | QN |
| --- | --- | --- | --- | --- | --- |
| 1 | 1 | 1 | 1 | Q | QN |
| 1 | 0 | 1 | 1 | 0 | 1 |
| 0 | 1 | 1 | 1 | 1 | 0 |
| 0 | 0 | 1 | 1 | 1 | 1 |
| X | 1 | 0 | 1 | 1 | 0 |
| 1 | X | 1 | 0 | 0 | 1 |
| X | X | 0 | 0 | 1 | 1 |

A schematic diagram of half of each latch is illustrated in FIG. 3, with a symbol of that structure, which correlates with the upper half of the latch of FIG. 2, illustrated in FIG. 3A. It will be evident from a consideration of FIGS. 2 and 3A together how two of the NAND gate—OR gate structures of FIG. 3 are connected together via the abovedescribed crosscoupling to form the latch of FIG. 2. The respective inputs of the OR gate 21, 23 are labeled A and B, its output being connected to one input of the NAND gate 17, 19, the remaining inputs of the NAND gate being labeled C and D.

The half-latch of FIG. 3 is formed of P channel field effect transistors (FETs) 25, 26 and 27 which have their drains connected together, and to an output node Z. The Z node is connected via the series of drain-source circuits of N channel FETs 29, 30 and 31.

The NAND gate portion of this circuit is further comprised of a C input connected to the gates of FETs 26 and 29, and a D input connected to the gates of FETs 27 and 30.

The OR gate portion of this circuit is further comprised of an A input connected to the gate of FET 25 and to the gate of a further N channel FET 33. FET 33 has its drain connected to the drain of FET 31 and its source to the source of FET 31, which is connected to ground. The source of FET 25 is connected to the to the drain of a P channel FET 24, which has its source connected to a voltage rail VDD in common with the sources of FETs 26 and 27. The gates of FETs 24 and 31 are connected to the B input.

A truth table defining the operation of the circuit of FIGS. 3 and 3A, and which provide the Boolean relationship /Z=(A+B)CD is as follows:

| A | B | C | D | Z |
| --- | --- | --- | --- | --- |
| 1 | X | 1 | 1 | 0 |
| X | 1 | 1 | 1 | 0 |
| 0 | 0 | X | X | 1 |
| X | X | 0 | X | 1 |
| X | X | X | 0 | 1 |

While a detailed discussion of the operation of the circuit of FIG. 3 would be redundant in view of the truth table noted above, it may be seen, for example, that if either of inputs A or B are at a high logic level, either one of FETs 24 or 25 are nonconductive. On the other hand, FET 33 and/or FET 31 can become conductive due to the high logic level applied to either of their gates. As a result, if both of NAND gate inputs C and D go to high logic level, (conforming to either of the two top truth table rows), FETs 26 and 27 are nonconductive, and FETs 29 and 30 become conductive. This causes output node Z to go to low logic level, shown in the truth table upper two rows as 0.

The result of the crosscoupling between the two latch halves, each operating as described in the above truth table, is operation of the latch shown in FIG. 2 in accordance with the truth table shown earlier in this description with reference to FIG. 2.

Figure 4:
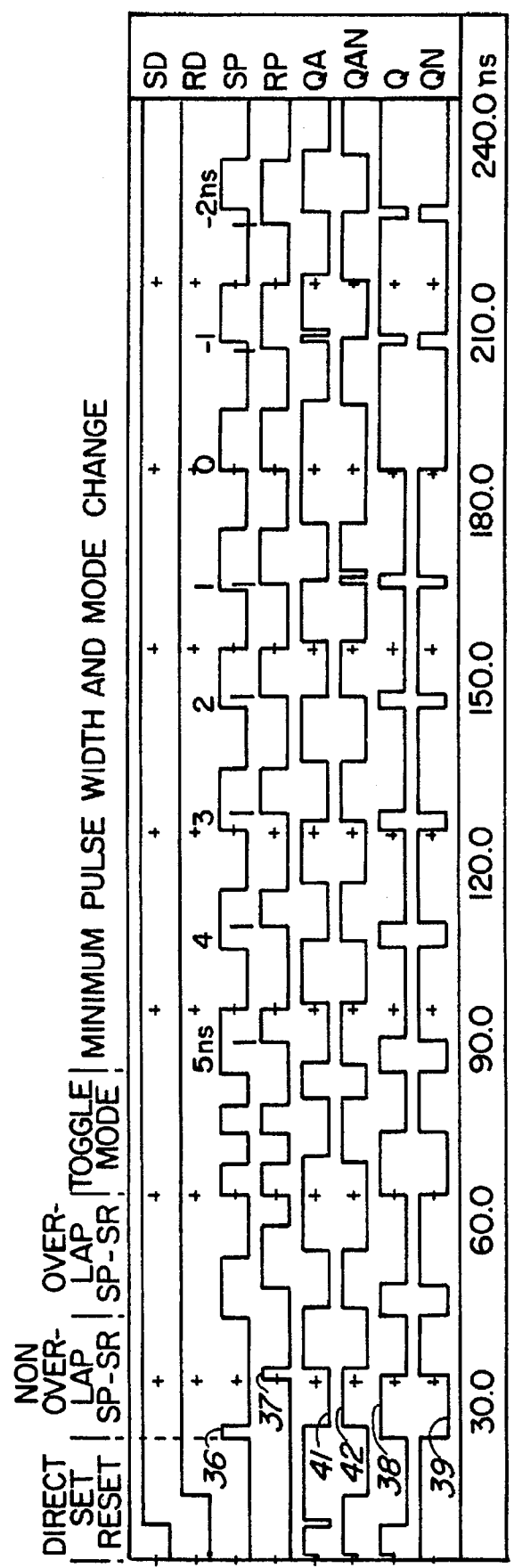
FIG. 4 is a timing diagram of the embodiment of FIG. 1.

Turning now to FIG. 4, input signals identified by SP and RP, labeled to conform with the correspondingly identified input terminals are shown, having various timing relationships demarcated at the top of the signal graphs.

Buffered (delayed) versions of the SP and RP signals are applied to the S1 and R1 inputs of latch 3. The result of these signals and the fed back signals from the Q and QN outputs of latch 5 result in the signals QA and QAN, 41 and 42, applied to the R2 and S2 inputs respectively of latch 5.

For example, in one case the SP and RP signals are not overlapping, as indicated at 36 (SP) and 37 (RP). Initially, the SP and RP signals are at a low logic level and both latch 3 and 5 have been reset, where their respective Q outputs are forced to low logic levels and their QN outputs to high logic levels. Because the SP signal and therefore the buffered S1 input of latch 3 is initially at a low logic level and the Q output of latch 5 fed back to the S2 input of latch 3 is also at a low logic level, the Q output of latch 3 is caused to go to a high logic level as soon as the reset condition (a low logic level on input RD) is removed. Consequently, the QN output of latch 3 will go to a low logic level (the complement of Q) because the high logic level of the QN output of latch 5 fed back to the R2 input of latch 3 prevents resetting the latch as a result of a low logic level on the R1 input of that latch (buffered RP input). The cross-coupled connection of latch 3 outputs (Q and QN) to latch 5 inputs (R2 and S2 respectively) places a low logic level on input S2 and a high logic level on input R2.

When input signal SP goes to a high logic level, and the S1 input of latch 5 goes to a low logic level through inverter 11, both S1 and S2 inputs of latch 5 are at low logic levels simultaneously thus causing the Q output (signal 38) to go to a high logic level and the QN output (signal 39) to go to a low logic level. When input signal SP returns to a low logic level, latch 3 input S1 goes to a low logic level while input S2 remains at a high logic level because of the high logic level fed back from the Q output of latch 5 in the previous operation. Therefore, no state changes occur in latch 3 or latch 5 when input signal SP returns to a low logic level.

The RP pulse 37 then arrives. When input signal RP goes to a high logic level, and the R1 input of latch 5 goes to a low logic level through invert 13, both R1 and R2 inputs of latch 5 are at low logic levels simultaneously thus causing the QN output (signal 39) to go to a high logic level and the Q output (signal 38) to go to a low logic level. When input signal RP returns to a low logic level, latch 3 input R1 goes to a low logic level while input R2 remains at a high logic level because of the high logic level fed back from the QN output of latch 5 in the previous operation. Therefore, no state changes occur in latch 3 or latch 5 when input signal RP returns to a low logic level.

The result is a pulse at the Q output which has a timed length corresponding to the time difference between the rising edges of the SP and RP signals.

FIG. 4 next illustrates SP and RP pulses which overlap in time. The leading edge of the SP pulse causes the Q and QN output pulse waveform to go to high and low logic levels respectively, and the QA and QAN logic levels to go to low and high levels respectively, as described earlier. However the RP pulse going to a high logic level before the SP pulse has gone to a low logic level causes the QN output pulse to rise to a high logic level, causing the Q output pulse level to drop to low logic level. When the SP pulse drops to a low level, the QA logic level rises to a high logic level, followed by the QAN logic level dropping to a low logic level.

As a result, the Q output pulse has a length that represents the time difference between the leading edges of the SP and RP pulses.

FIG. 4 next illustrates a toggle mode, in which the SP and RP pulses are pulsing in unison. In this case the rising edge of the SP pulse causes the Q output logic level to go high, followed by the QN pulse going to a low logic level, as described earlier. In this case, however, the leading edge of the RP signal has no effect (being in unison with the SP signal). In this case the next rising edge of SP and RP the RP signal causes the QN signal to rise to a high logic level which causes the Q signal to drop to a low logic level.

For the toggle mode, therefore, the Q signal pulse has a length which is determined by the time between successive rising edges of the input SP and RP signal pulses.

In the portion of FIG. 4 which is to the right of the toggle mode example, a succession of SP pulses is shown, each having equal length. A succession of RP pulses is also shown having successively increasing length, from a length smaller than the length of the SP pulses to a length longer than the length of the SP pulses. The RP pulse falling edges coincide with the falling edges of the SP pulses, resulting in leading edges of the RP pulses which first follow the leading edges of the SP pulses, but with successively shorter intervals, finally leading the leading edges of the SP pulses with successively increasing intervals.

As may be seen, the length of the Q pulses output from the circuit, which represent the timing differential between the SP and RP leading edges, become progressively smaller, until the coincidence. Coincidence of the leading edges is similar to the beginning of the toggle mode, and therefore the Q logic level remains high (and the QN pulse remains low) until the leading edge of the RP pulse arrives, at which time the QN pulse rises to high logic level, causing the Q output logic level to go to low logic level.

The structure operates in the reverse of the case of the leading edge of the SP pulse leading the leading edge of the RP pulse, with overlap of the pulses, as in the second case described above. In this reverse case, the length of the QN output pulse is an indication of the differential timing between the leading edges of the RP pulse and the SP pulse; i.e. the Q and QN, and QA and QAN signals are reversed from the second case described above.

It may thus be seen that the timing of the output pulse signal, representing the timing difference between the leading edges of the input SP and RP signals, do not depend on the recovery time of a flip flop, and cause the output pulse to depend on circuits driven to directly respond to the leading edges. Very narrow output pulses can be generated from overlapping SP and RP pulses; for example in one laboratory prototype, about 2.5 nanosecond long. One application of timing and the generation of very short pulses is in integrated circuit testing.

The above circuit has active low direct set and reset inputs SD and RD, which are respectively connected to the remaining inputs of NAND gates 17 and 19. These inputs can be used to force a particular logic level output from each latch (see FIGS. 1 and 2). The SD inputs of latches 3 and 5 are connected together and the RD inputs of latches 3 and 5 are connected together, to facilitate this mode of operation.

Both direct set and reset are shown asserted simultaneously low at the extreme left hand side of FIG. 4. With the application of a high logic level SD signal which RD is held to a low logic level, the edge creates a reset condition which causes the Q output to go to low logic level and the QN output to remain at a high logic level regardless of the levels on SP and RP signals, as shown in the fourth row of the associated truth table.

With the application of a high logic level RD signal, the reset condition is removed and the SP and RP signals can now be used to set and clear the output as shown in the first three rows of the truth table.

The above can be used to create other useful circuits which are improvements over prior art circuits, due to the advantages described above.

Figure 5:
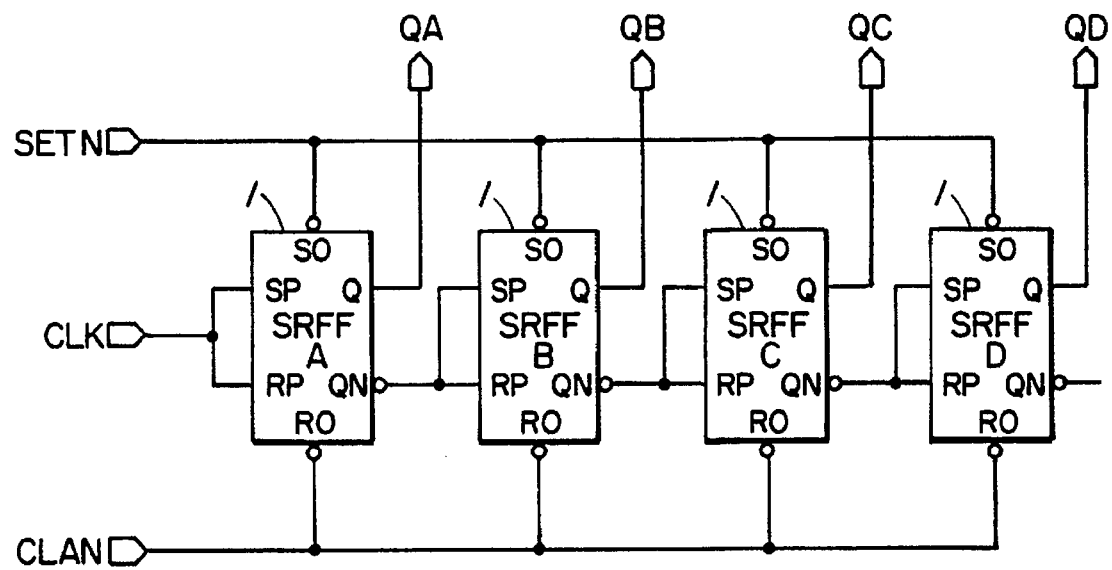
FIGS. 5, 6 and 7 are logic diagrams of embodiments of the invention in the form of a ripple counter, a pulse generator and a rising edge detector, which use the embodiment of FIG. 1.

FIG. 5 illustrates a ripple counter. Plural SRFFs 1 have their SD inputs connected in parallel to a SETN signal pulse source, and their RD inputs connected in parallel to a reset CLRN signal source. A source of clock signals CLK is connected to the SP and RP inputs of a first SRFF 1. The QN output of each SRFFs is connected to the SP and RP inputs of a following SRFF, except a last SRFF in line. QA, QB, QC, QD etc. outputs are connected to the Q output terminals of corresponding SRFFs.

In operation, the clock signal is applied to the first SRFF in line, in the toggle mode described above, i.e. to both inputs simultaneously. The first SRFF outputs a pulse cycle which is twice as long as the input pulse cycle, as shown in FIG. 4. That signal is applied to the next SRFF in toggle mode, which outputs a pulse cycle that is twice as long as its input. This procedure is followed for each SRFF in turn, the cycle length being twice as long for each successive SRFF.

The result are output signals on the output leads QA, QB, QC, QD, etc. which are successively twice as long as signals on preceding output leads, which signals can be used as a binary count of the number of clock pulses received.

Figure 6:
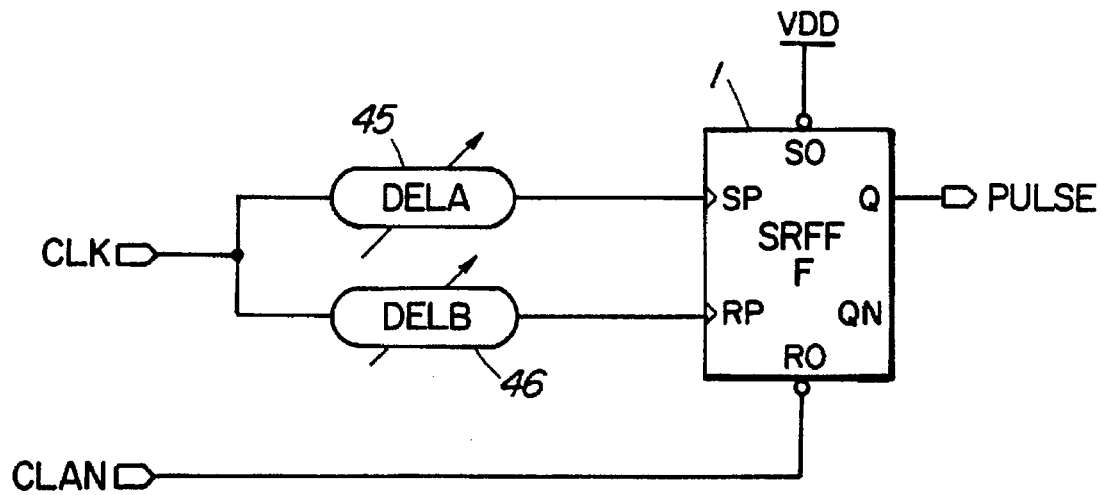

FIG. 6 illustrates a pulse generator. A clock signal CLK is applied to the inputs of a pair of delay lines 45 and 46, which have unequal delays. The outputs of the delay lines are connected to the SP and RP inputs respectively of an SRFF 1. Its SD input is connected to a voltage rail VDD, and its RD input is connected to a source of a clear pulse CLRN.

The clock pulse applied to the delay lines 45 and 46 results in differential signals applied to the SP and RP inputs of SRFF 1. The rising edge placement of the pulse signal at the output Q is defined by the delay programmed into the delay line 45, while the falling edge placement of the output pulse is defined by the delay programmed into the delay line 46.

Figure 7:
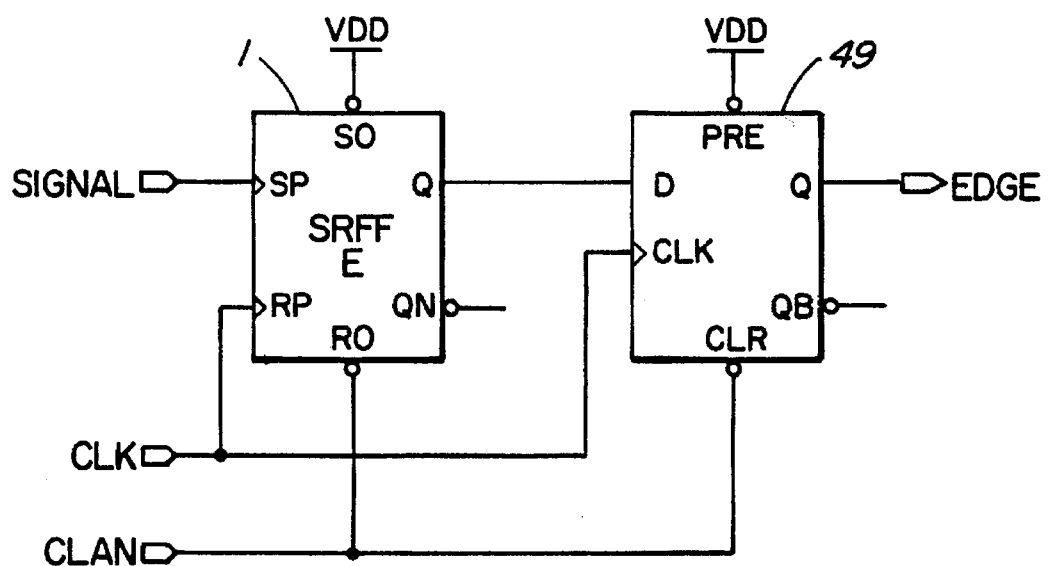

FIG. 7 illustrates a rising edge detector. This circuit illustrates an SRFF 1 which has its SD input connected to a voltage rail VDD, its SP input connected to a source of signal, and its RP input connected to a clock source CLK. A clear signal CLRN is applied to its RD input.

The Q output from the SRFF is connected to the D input of a D-type flip flop 49. The preset input of flip flop 49 is connected to the voltage rail VDD. The CLK signal is applied to the CLK input of the flip flop 49, and the CLRN signal is applied to the CLR input of flip flop 49. The Q output of the flip flop provides the indication of the presence of an edge of the input signal, on the EDGE output terminal.

This circuit can detect the presence of one or more rising edges of the input signal occurring any time within the time defined by the rising edges of successive clock pulses. The circuit forms a two stage pipeline wherein edge detection in one clock cycle is output on the next clock cycle.

Because this circuit exhibits very little dead time surrounding the clock rising edge, it can function at very high clock rates.

A person understanding this invention may now conceive of alternative structures and embodiments or variations of the above. All of those which fall within the scope of the claims appended hereto are considered to be part of the present invention.

I claim:

1. A timer comprising:

(a) first and second gated SR (set-reset) latches each including two pair of inputs S1, S2 and R1, R2 and a pair of outputs Q, QN, (b) the Q output of the first gated SR latch being connected to the R2 input of the second gated SR latch, and the QN output of the first gated SR latch being connected to the S2 input of the second gated SR latch, (c) the Q output of the second gated SR latch being connected to the S2 input of the first gated SR latch, and the QN output of the second gated SR latch being connected to the R2 input of the first gated SR latch, (d) means for applying a delayed representation of a first pulse signal to the S1 input of the first gated SR latch and means for applying a delayed representation of a second pulse signal to the R1 input of the first gated SR latch, (e) means for applying an inverted representation of the first pulse signal to the S1 input of the second gated SR latch and means for applying an inverted representation of the second pulse signal to the R1 input of the second gated SR latch, whereby output signals representing a differential between leading edges of the first and second pulse signals are provided at the outputs Q, QN of the second gated SR latch.

2. A timer as defined in claim 1 in which each of the means for applying inverted and delayed representations of the first and second pulse signals is comprised of an inverter.

3. A timer as defined in claim 1 in which each of the first and second gated SR latches has set and reset inputs SD and RD, the SD inputs being connected together and the RD inputs being connected together, each of the first and second gated SR latches being comprised of a pair of logic circuits each having a Boolean transfer function /Z=(A+B)CD where /Z represents the logic level at an output Q or QN, A and B represent pairs of inputs S1, S2 or R1, R2 and C and D represent directly set input logic levels SD or RD.

4. A ripple counter comprising a plurality of timers each as defined in claim 3, a clock source being connected to both inputs together of a first timer of said plurality of timers, means for applying a direct set logic signal to the SD inputs of all the timers together, means for applying a direct reset logic signal to the RD inputs of all the timers together, the QN output of each of the timers except a last timer being connected to both inputs together of a following timer, and means for providing a count output signal from the Q output of each of the timers.

5. A pulse generator comprising a pair of delay lines having different delays, means for applying a clock signal to an input of both of the delay lines, a timer as defined in claim 3, outputs of the delay lines being connected to respective inputs of the timer, means for applying a high logic level signal to the SD input of the timer and means for applying a direct reset signal to the RD input of the timer, and means for providing a pulse output signal from the Q output of the timer.

6. A rising edge detector comprising a timer as defined in claim 3, a D-type flip-flop, means for applying an input signal to one input of the timer, the Q output of the timer being connected to a D input of the flip flop, means for applying a clock signal to the other input of the timer and to a clock input of the flip flop, means for applying a high logic level signal to the SD input of the timer and to a preset input of the flip flop, means for applying a reset signal to the RD input of the timer and to a clear input of the flip flop, and means for providing an output signal representing detection of a rising edge of the input signal at a Q output of the D-type flip flop.

* * * * *